United States Patent
Sun

(10) Patent No.: US 8,422,315 B2
(45) Date of Patent: Apr. 16, 2013

(54) MEMORY CHIPS AND MEMORY DEVICES USING THE SAME

(75) Inventor: Chi Hsiang Sun, Kaohsiung (TW)

(73) Assignee: Winbond Electronics Corp., Taichung County (TW)

( * ) Notice: Subject to any disclaimer, the term of this patent is extended or adjusted under 35 U.S.C. 154(b) by 424 days.

(21) Appl. No.: 12/830,967

(22) Filed: Jul. 6, 2010

(65) Prior Publication Data

US 2012/0011327 A1    Jan. 12, 2012

(51) Int. Cl.
*G11C 7/06* (2006.01)
(52) U.S. Cl. ......... 365/189.07; 365/185.09; 365/185.17; 365/185.19
(58) Field of Classification Search ............. 365/185.09, 365/185.17, 185.19, 185.24, 185.33, 189.07, 365/194, 222, 232, 233.1
See application file for complete search history.

(56) References Cited

U.S. PATENT DOCUMENTS

| | | | |
|---|---|---|---|
| 5,844,843 A * | 12/1998 | Matsubara et al. ...... | 365/185.24 |
| 7,057,937 B1 * | 6/2006 | Matsubara et al. ...... | 365/185.24 |
| 7,221,602 B2 * | 5/2007 | Micheloni et al. ............ | 365/194 |
| 7,236,407 B2 * | 6/2007 | Roohparvar et al. ..... | 365/185.33 |
| 7,450,426 B2 * | 11/2008 | Li et al. ..................... | 365/185.19 |
| 7,474,561 B2 * | 1/2009 | Li et al. ..................... | 365/185.17 |
| 7,983,111 B2 * | 7/2011 | Mizoguchi ................. | 365/233.1 |
| 2005/0141314 A1 * | 6/2005 | Ito et al. ......................... | 365/222 |
| 2006/0140043 A1 * | 6/2006 | Roohparvar et al. ......... | 365/232 |
| 2007/0143556 A1 | 6/2007 | Kadota | |
| 2008/0084751 A1 * | 4/2008 | Li et al. ..................... | 365/185.19 |
| 2008/0084752 A1 * | 4/2008 | Li et al. ..................... | 365/185.19 |
| 2011/0063909 A1 * | 3/2011 | Komatsu ................. | 365/185.09 |

* cited by examiner

*Primary Examiner* — Harry W Byrne
(74) *Attorney, Agent, or Firm* — Muncy, Geissler, Olds & Lowe, PLLC

(57) ABSTRACT

A memory chip is provided and includes a control unit, a wait controller, and a wait receiver. When the memory chip operates in an active mode and the control unit determines that the memory chip will be changed to operate in an inactive mode according to an input address signal, the wait controller changes a state of a wait signal at a wait pad from a de-asserted state to an asserted state. When the memory chip operates in an inactive mode and the wait receiver detects that the state of the wait signal has been changed from the de-asserted state to the asserted state, the control unit determines whether the memory chip will be changed to operate in the active mode or a word-line boundary crossing operation will be performed to another memory chip.

19 Claims, 5 Drawing Sheets

MEMORY CHIPS AND MEMORY DEVICES USING THE SAME

BACKGROUND OF THE INVENTION

1. Field of the Invention

The invention relates to a memory chip, and more particularly to a memory device which can detect the occurrence of a die boundary crossing operation between two memory chips by monitoring a wait pad.

2. Description of the Related Art

For a conventional memory chip, such as a CRAM (cellular RAM) chip, after the last word on an active word line is read/written, a boundary crossing operation is performed to switch the reading/writing operation to a next word line; that is, the one word line becomes inactive while the next word line becomes active. The reading/writing operation can be performed continuously on the next word line. When the boundary crossing operation is performed, a signal at a wait pad of the memory chip is asserted until the next word line is active. Thus, by monitoring the wait pad, status of the reading/writing operation may be known by users.

In some applications, at least two memory chips can be stacked to form a memory device. A boundary crossing operation may be performed between the last word line of a top memory chip and the first word line of a bottom memory chip; that is, the last word line of the top memory chip becomes inactive while the first word line of the bottom memory chip becomes active. In this case, the boundary crossing operation is referred to as a "die boundary crossing operation".

Thus, it is desired to provide a memory device which can detect the occurrence of a die boundary crossing operation between two memory chips.

BRIEF SUMMARY OF THE INVENTION

An exemplary embodiment of a memory chip comprises a control unit, a wait controller, and a wait receiver. The control unit receives an input address signal and at least one command signal, determines and controls an operation mode of the memory chip according to the input address signal and the at least one command signal, and generates a first control signal according to the determination result. The wait controller is coupled to a wait pad. The wait controller further receives the first control signal and changes a state of a wait signal at the wait pad according to the first control signal. The wait receiver is coupled to the wait pad to receive the wait signal and detects the state of the wait signal to generate a second control signal. When the control unit determines that the memory chip, operating in an active mode, will be changed to operate in an inactive mode according to the input address signal, the wait controller changes the state of the wait signal from a de-asserted state to an asserted state according to the first control signal. When the wait receiver detects that the state of the wait signal has been changed from the de-asserted state to the asserted state, the control unit determines whether the memory chip, operating in the inactive mode, will be changed to operate in the active mode according to the input address signal and the second control signal.

An exemplary embodiment of a memory device comprises a first memory chip and a second memory chip. Both of the first and second memory chips receive an input address signal and at least one command signal. Both of the first and second memory chips are coupled to a wait pad. The first memory chip and the second memory chip alternately operate in an active mode, and each of the first memory chip and the second memory chip comprises a control unit, a wait controller, and a wait receiver. The control unit receives the input address signal and the at least one command signal, determines and controls an operation mode of the corresponding memory chip according to the input address signal and the at least one command signal, and generates a first control signal according to the determination result. The wait controller is coupled to the wait pad. The wait controller further receives the first control signal and changes a state of a wait signal at the wait pad according to the first control signal. The wait receiver is coupled to the wait pad to receive the wait signal and detects the state of the wait signal to generate a second control signal. When the first memory chip operates in an active mode and the second memory chip operates in an inactive mode, if the control unit of the first memory determines that the first memory chip will be changed to operate in the inactive mode according to the input address signal, the wait controller of the first memory changes the state of the wait signal from a de-asserted state to an asserted state according to the corresponding first control signal. When the wait receiver of the second memory chip detects that the state of the wait signal has been changed from the de-asserted state to the asserted state, the control unit of the second memory chip determines whether the second memory chip will be changed to operate in the active mode according to the input address signal and the corresponding second control signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
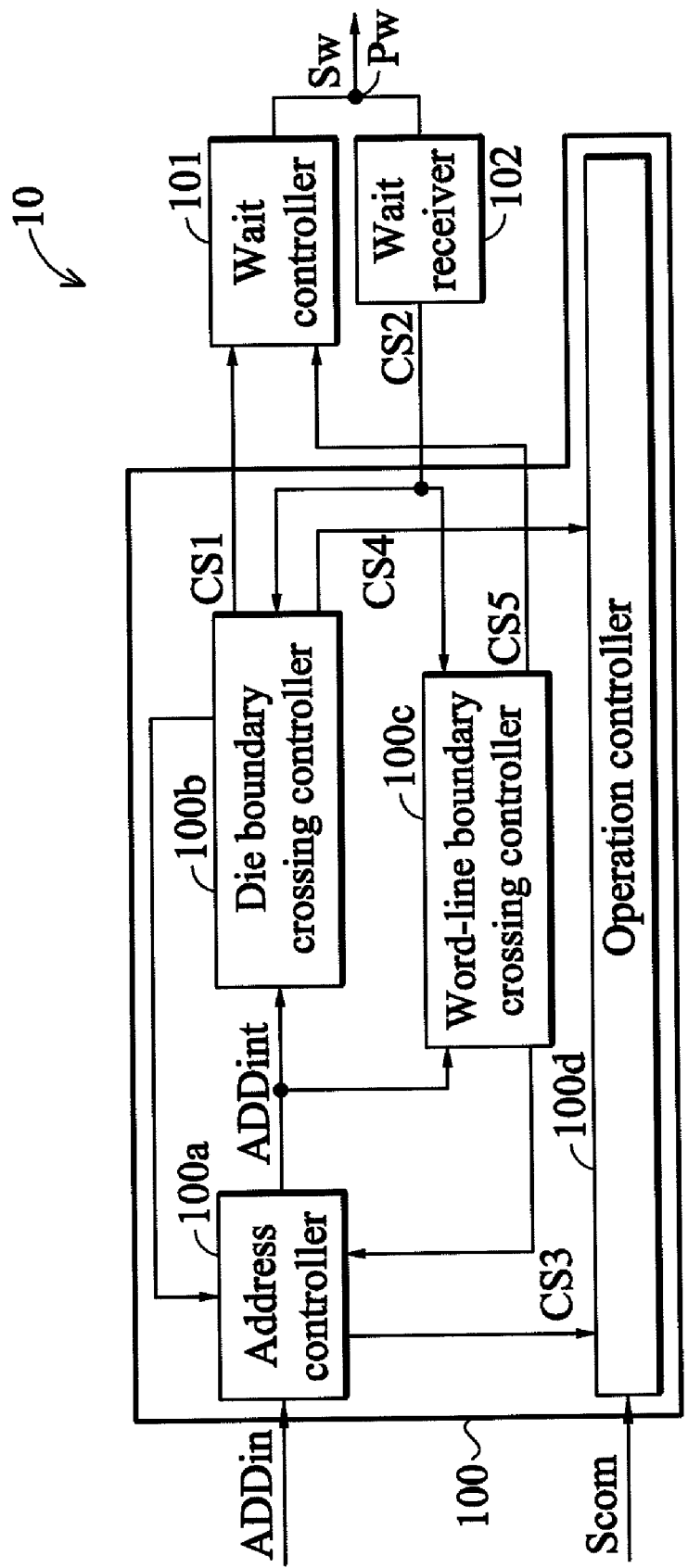
FIG. 1 shows an exemplary embodiment of a memory chip.

Memory chips are provided. In an exemplary embodiment of a memory chip 10 in FIG. 1, a memory chip 10 receives an input address signal ADDin and at least one command signal Scorn. Moreover, the memory chip 10 is coupled to a wait pad Pw. As shown in FIG. 1, the memory chip 10 comprises a control unit 100, a wait controller 101, and a wait receiver 102. The input address signal ADDin is provided to the control unit 100. In the embodiment, the input address signal ADDin may be input by a user or a front-end device. The control unit 100 determines and controls an operation mode of the memory chip 10, such as an active mode or an inactive mode, according to the input address signal ADDin and the at least one command signal Scorn and generates a control signal CS1 according to the determination result. The wait controller 101 is coupled to the wait pad Pw and receives the control signal CS1 from the control unit 100. The wait controller 101 changes a state of a wait signal Sw at the wait pad Pw according to the control signal CS1. The wait receiver 102 is coupled to the wait pad Pw for receiving the wait signal Sw. The wait receiver 102 further detects the state of the wait signal Sw to generate a control signal CS2 to the control unit 100.

Assume that the memory chip 10 operates in an active mode. When the control unit 100 determines that the memory chip 10 will be changed to operate in the inactive mode according to the input address signal ADDin and the least one command signal Scorn, wait controller 101 changes the state of the wait signal Sw from a de-asserted state to an asserted state according to the control signal CS1. After, the memory chip 10 is changed to operate in the inactive mode. In the other hand, when the memory chip 10 operates in the inactive mode and the wait receiver 102 detects that the state of the wait signal Sw has been changed from the de-asserted state to the asserted state to generate the control signal CS2, the control unit 100 determines whether the memory chip 10 will be changed to operate in the active mode according to the input address signal ADDin and the control signal CS2. After the control unit 100 determines that the memory chip 10 will be changed to operate in the active mode, the control unit 100 controls the memory chip 10 to operate in the active mode.

The detailed description of the operations of the memory chip 10 will be described in the following. As shown in FIG. 1, the control unit 100 comprises an address controller 100a, a die boundary crossing controller 100b, a word-line boundary crossing controller 100c, and an operation controller 100d. The address controller 100a receives the input address signal ADDin and generates an internal address signal ADDint and a control signal CS3 according to the input address signal ADDin. The internal address signal ADDint comprises a row address for word lines and a column address for bit lines, wherein the row address indicates the word line which is occupied by a reading-writing operation. The die boundary crossing controller 100b receives the internal address signal ADDint. The die boundary crossing controller 100b determines whether a die boundary crossing operation will be performed according to the internal address signal ADDint and the control signal CS2 and generates the control signal CS1 and a control signal CS4 according to the determination result. The operation controller 100d receives the control signal CS3, the control signal CS4, and the least one command signal Scorn and controls the operation of the memory chip 10 according to the control signals CS3 and CS4; that is, the operation 100d controls the memory chip 10 to operate in the active mode or the inactive mode. The word-line boundary crossing controller 100c also receives the internal address signal ADDint. The word-line boundary crossing controller 100c determines whether a word-line boundary crossing operation will be performed to the memory chip 10 and generates a control signal CS5 according to the determination result for the wait controller 101. The word-line boundary crossing controller 100c further determines whether the word-line boundary crossing operation will be performed to another memory chip, which is coupled to the wait pad Pw, according to the internal address signal ADDint and the control signal CS2 from the wait receiver 102.

Assume that the operation controller 100d controls the memory chip 10 to operate in the active mode according to the control signal CS3 and the at least one command signal Scorn at the beginning, and a reading/writing operation is performed to a current word line. If the word-line boundary crossing controller 100c determines that the word-line boundary crossing operation will be performed according to the internal address signal ADDint, the wait controller 101 changes the state of the wait signal Sw from the de-asserted state to the asserted state according to the control signal CS5. At this time, the word-line boundary crossing controller 100c updates the address controller 100a to change the internal address signal ADDint. After the wait controller 101 changes the state of the wait signal Sw from the asserted state to the de-asserted state, the word-line boundary crossing operation is completed, so that performance of the reading/writing operation to the object is switched from the current word line to the next word line; that is, the current word line becomes inactive while the next word line becomes active.

When the reading/writing operation is performed to the last word line of the memory chip 10, if the die boundary crossing controller 100b determines that the memory chip 10 will be changed to operate in the inactive mode according to the internal address ADDint, the wait controller 101 changes the state of the wait signal Sw from the de-asserted state to the asserted state according to the control signal CS1 from the die boundary crossing controller 100b. At this time, the die boundary crossing controller 100b updates the address controller 100a to change the internal address signal ADDint. After the wait controller 101 changes the state of the wait signal Sw from the asserted state to the de-asserted state, the die boundary crossing operation is completed, and the operation controller 100d controls the memory chip 10 to operate in the inactive mode according to the control signal CS4 from the die boundary crossing controller 100b. Meanwhile, another memory chip, which is coupled to the wait pad Pw, is switched to operate in the active mode from the inactive mode. The above switching operation between the two memory chips is referred as a "die boundary crossing operation".

After the memory chip 10 is switched to operate in the inactive mode, the memory chip 10 continuously operates in the inactive mode until another die boundary crossing operation is detected by monitoring of the wait pad Pw by the wait receiver 102.

When the memory chip 10 operates in an inactive mode, if the wait receiver 102 detects that the state of the wait signal Sw has been changed from the de-asserted state to the asserted state by another memory chip which is coupled to the wait pad Pw, the die boundary crossing controller 101b determines whether the memory chip 10 will be changed to operate in the active mode according to the internal address signal ADDint and the control signal CS2, and the word-line boundary crossing controller 100c determines whether the word-line boundary crossing operation will be performed to the another memory chip according to the internal address signal ADDint and the control signal CS2. If the word-line boundary crossing controller 100c determines that the word-line boundary crossing operation will be performed to the another memory chip, the word-line boundary crossing controller 100c updates the address controller 100a to change the internal address signal ADDint.

In the other hand, the die boundary crossing controller 100b also receives the control signal CS2 from the wait receiver 102. If the die boundary crossing controller 100b determines that the memory chip 10 will be changed to operate in the active mode according to the internal address signal ADDint and the control signal CS2, the die boundary crossing controller 100b then updates the address controller 100a according to the control signal CS2 to change the internal address signal ADDint. After, the operation controller 100d controls the memory chip 10 to operate in the active mode according to the control signal CS4.

According to the description above, when one of a word-line boundary crossing operation and a die boundary crossing operation will be performed to the memory chip 10, the wait controller 101 changes the state of the wait signal Sw from the de-asserted state to the asserted state. Thus, by monitoring the state of the wait signal Sw at the wait pad Pw, a user, a back-end device, or another memory chip coupled to the memory chip 10 can detect that the word-line boundary crossing operation or the die boundary crossing operation is being performed.

Figure 2:
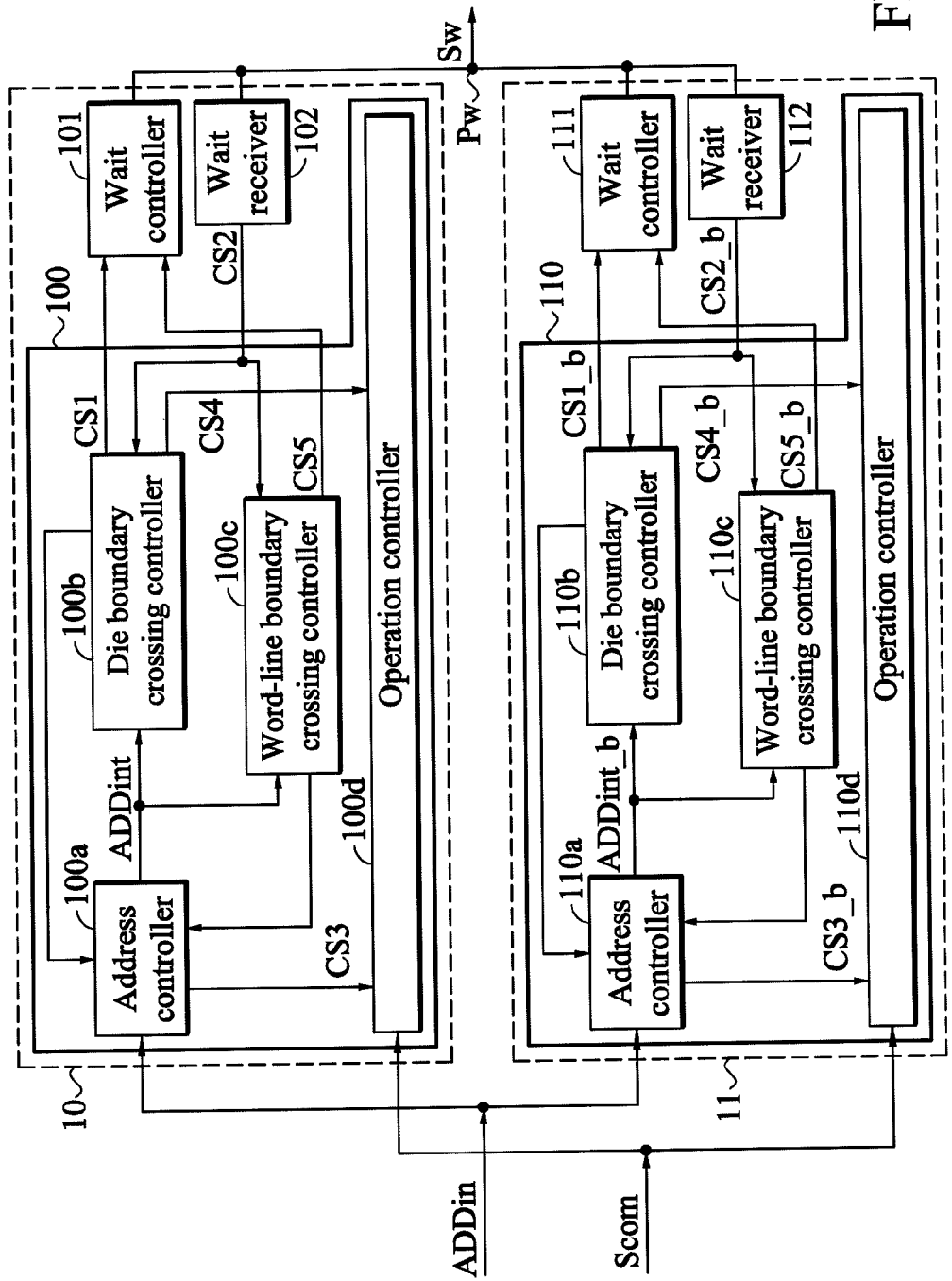
FIG. 2 shows an exemplary embodiment of a memory device.

In some embodiments, the memory chip 10 can be implemented as one of two stacked memory chips in a memory device. As shown in FIG. 2, a memory device 2 comprises the memory chip 10 and another memory chip 11. The memory chip 10 is stacked on the memory chip 11. Thus, the memory chip 10 is referred as a "top memory chip", and the memory chip 11 is referred as a "bottom memory chip". The input address signal ADDin is provided to the top memory chip 10 and the bottom memory 11. Both of the top memory chip 10 and the bottom memory 11 are coupled to the wait pad Pw.

Referring to FIG. 2, the bottom memory chip 11 comprises the same elements as the top memory chip 10. The bottom memory chip 11 comprises a control unit 110, a controller 111, and a wait receiver 112. The control unit 110 comprises an address controller 110a, a die boundary crossing controller 110b, a word-line boundary crossing controller 110c, and an operation controller 110d. The signals which are generated in the bottom memory chip 11 and correspond to the signals ADDint and CS1-CS5 in the top memory chip 10 are represented by "ADDint_b", "CS1_b", "CS2_b", "CS3_b", "CS4_b", and "CS5_b", respectively. Accordingly, the top memory chip 10 and the bottom memory chip 11 perform the same operations. The detailed description of the operation of the elements in the bottom memory chip is omitted here.

In the following, the word-line boundary crossing operation in one of the memory chips 10 and 11 and the die boundary crossing operation between the memory chips 10 and 11 will be described with reference to FIGS. 2 and 3.

Assume that, at the beginning, the operation controller 110d controls the bottom memory chip 11 to operate in the inactive mode according to a corresponding control signal CS3_b, the operation controller 100d controls the top memory chip 10 to operate in the active mode according to the control signal CS3, and a reading/writing operation is performed to a current word line of the memory chip 10. If the word-line boundary crossing controller 100c determines that the word-line boundary crossing operation will be performed according to the internal address signal ADDint, the wait controller 101 changes the state of the wait signal Sw from the de-asserted state to the asserted state according to the control signal CS5. Moreover, the word-line boundary crossing controller 100c updates the address controller 100a to change the internal address signal ADDint. At the same time, the wait receiver 112 of the bottom memory chip 11 detects that the state of the wait signal Sw has been changed from the de-asserted state to the asserted state, and the word-line boundary crossing controller 110c determines that the word-line boundary crossing operation will be performed to the top memory chip 10 according to the internal address signal ADDint_b and the control signal CS2_b. The word-line boundary crossing controller 110c also updates the address controller 110a to change the internal address signal ADDint_b. After the wait controller 101 changes the state of the wait signal Sw from the asserted state to the de-asserted state, the word-line boundary crossing operation is completed to the top memory chip 10, so that performance of the reading/writing operation to the object is switched from the current word line to the next word line; that is, the current word line becomes inactive while the next word line becomes active.

Figure 3:
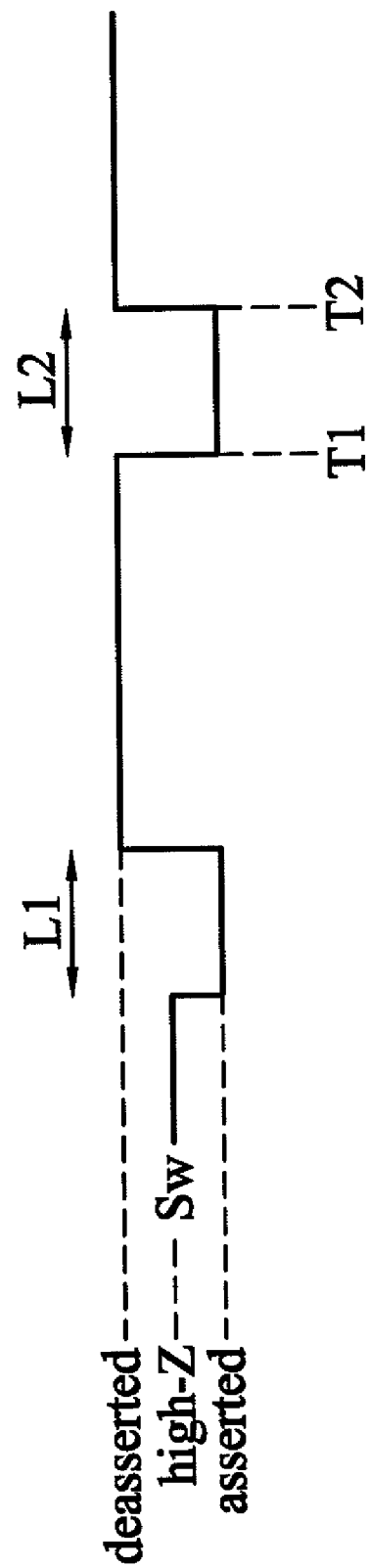
FIG. 3 shows a timing chart of the wait signal in FIG. 2.

When the reading/writing operation is performed to the last word line of the top memory chip 10, if the die boundary crossing controller 100b determines that the top memory chip 10 will be changed to operate in the inactive mode according to the internal address signal ADDint, the wait controller 101 changes the state of the wait signal Sw from the de-asserted state to the asserted state at the time point T1 in FIG. 3 according to the control signal CS1 from the die boundary crossing controller 100b. Moreover, the die boundary crossing controller 100b updates the address controller 100a to change the internal address signal ADDint. At the same time, the wait receiver 112 detects that the state of the wait signal Sw has been changed from the de-asserted state to the asserted state, and the die boundary crossing controller 110b determines that the top memory chip 10 will be changed to operate in the inactive mode and the bottom memory chip 11 will be changed to operate in the active mode according to the internal address signal ADDint_b and the control signal CS2_b. Next, the die boundary crossing controller 110b then updates the address controller 110a according to the control signal CS2_b to change the internal address signal ADDint_b. After the wait controller 101 changes the state of the wait signal Sw from the de-asserted state to the asserted state at the time point T1, the latency L2 in FIG. 3 occurs. After the state of the wait signal Sw is changed from the asserted state to the de-asserted state at the time point T2, the die boundary crossing is completed. Also, the controller 100d controls the top memory chip 10 to operate in the inactive mode according to the control signal CS4, and the operation controller 110d controls the bottom memory chip 11 to operate in the active mode according to the control signal CS4_b. The above switching operation between the two memory chips 10 and 11 is referred as a "die boundary crossing operation".

After the top memory chip 10 is switched to operate in the inactive mode and the bottom memory chip 11 is switched to operate in the active mode, the top memory chip 10 continuously operates in the inactive mode, and the bottom memory chip 11 continuously operates in the active mode. Thus, when a boundary crossing operation for word lines will be performed to the bottom memory chip 11 or a die boundary crossing operation will be performed, the top memory chip 10 performs the above operations of the bottom memory chip 11, and the bottom memory chip 11 performs the above operations of the top memory chip 10.

According to the embodiment of FIG. 2, when two memory chips are stacked to form a memory device, by monitoring the wait pad Pw, it is detected that the word-line boundary crossing operation or the die boundary crossing operation will be performed. Further, according to a corresponding internal address signal and the wait signal Sw, it can be known by the inactive memory chip when preparation is being made to switch to the active mode, and it can be known by the active memory chip when preparation is being made to switch to the inactive mode.

Figure 4:
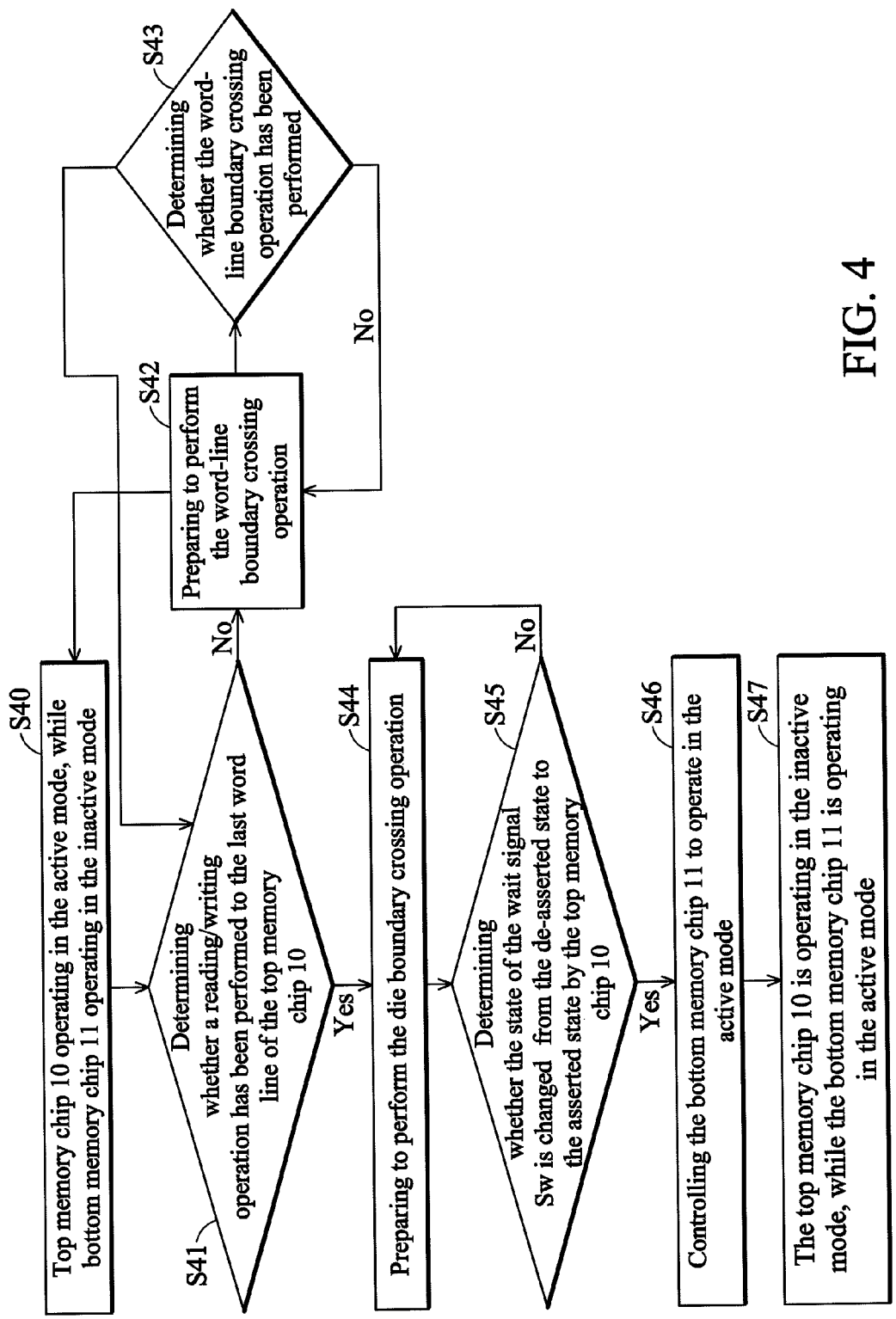
FIG. 4 is a flow chart of an exemplary embodiment of the operation method of the memory device in FIG. 2.

FIG. 4 is a flow chart of an example embodiment of the operation method of the memory device in FIG. 2. Assume, at the beginning, according to the input address signal ADDin and the at least one command signal Scom, the operation controller 100d controls the top memory chip 10 to operate in the active mode, while the operation controller 110d controls the bottom memory chip 11 to operate in the inactive mode (step S40). Then, the word-line boundary crossing controller 100c determines whether a reading/writing operation has been performed to the last word line of the top memory chip 10 according to the internal address signal ADDint derived from the input address signal ADDin (step S41). If the word-line boundary crossing controller 100c determines that a reading/writing operation is not performed to the last word line of the top memory chip 10, the word-line boundary crossing controller 100c prepares to perform the word-line boundary crossing operation (step S42). Then, the word-line boundary crossing controller 100c determines whether the word-line boundary crossing operation has been performed (step S43). If the word-line boundary crossing operation has been performed, the operation method returns to the step S41. If the word-line boundary crossing operation has not been performed, the operation method returns to the step S42.

If the word-line boundary crossing controller 100c determines that a reading/writing operation has been performed to the last word line of the top memory chip 10 in the step S41, the die boundary crossing controller 100b prepare to perform the die boundary crossing operation (step S44). Then, the wait receiver 112 of the bottom memory chip 11 determines whether the wait controller 101 of the top memory chip 10 has changed the state of the wait signal Sw from the de-asserted state to the asserted state (step S45). If the wait receiver 112 determines that the wait controller 101 has not changed the state of the wait signal Sw from the de-asserted state to the asserted state, the operation method returns to the step S44. If the wait receiver 112 determines that the wait controller 101 has changed the state of the wait signal Sw from the de-asserted state to the asserted state, the operation controller 110d controls the bottom memory chip 11 to operate in the active mode (step S46). Then, the top memory chip 10 operates in the inactive mode, while the bottom memory chip 11 operates in the active mode (step S47).

Figure 5:
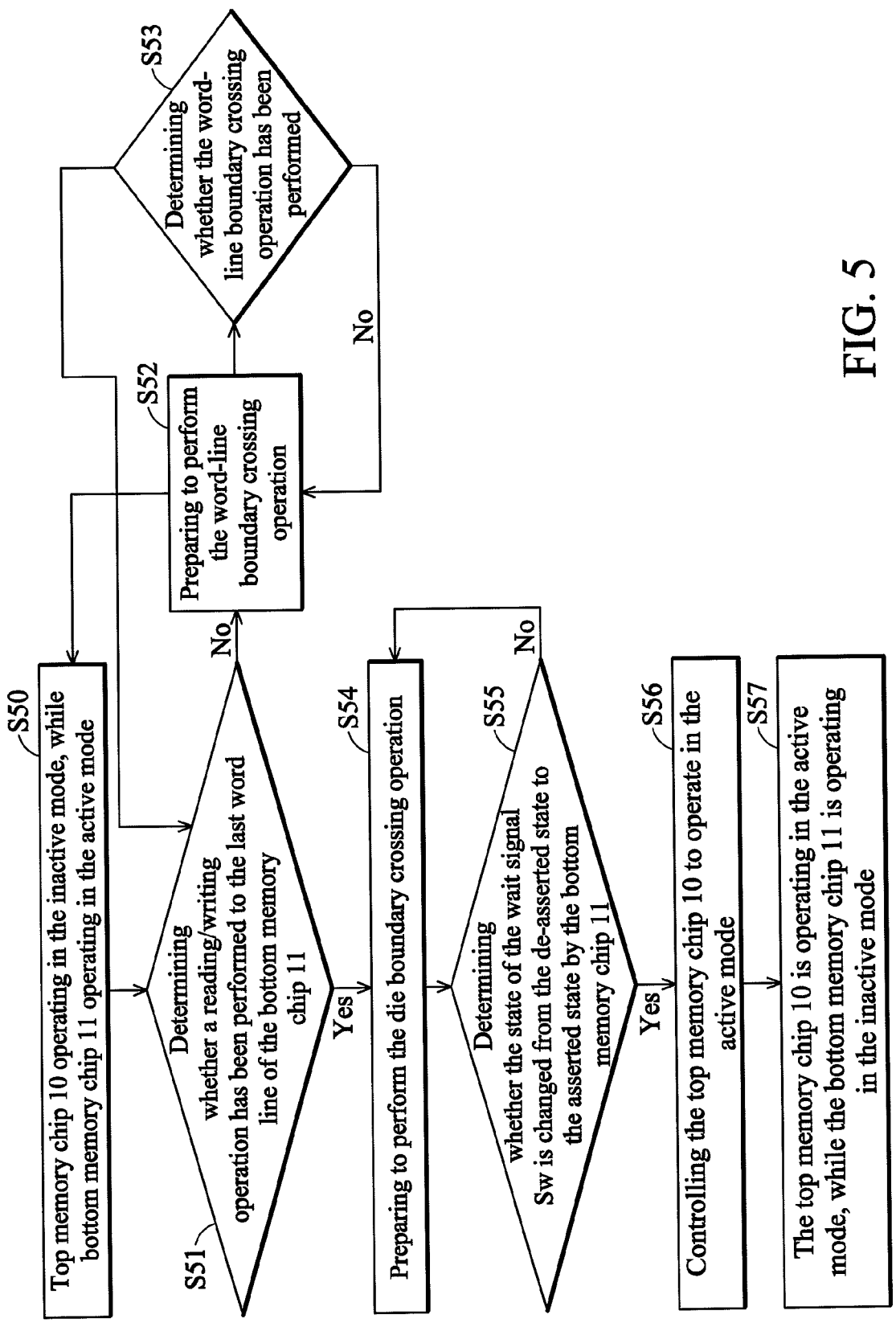
FIG. 5 is a flow chart of another exemplary embodiment of the operation method of the memory device in FIG. 2.

Assume, according to the input address signal ADDin and the at least one command signal Scorn, the operation controller 100d controls the top memory chip 10 to operate in the inactive mode, while the operation controller 110d controls the bottom memory chip 11 to operate in the active mode. A word-line boundary crossing operation in the memory chip 11 and a die boundary crossing operation between the memory chips 10 and 11 are performed according to steps S50-S57 of the flow in FIG. 5. The procedure of FIG. 5 is similar to that of FIG. 4. Thus, the related description is omitted here.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory chip comprising:
 a control unit for receiving an input address signal and at least one command signal, determining and controlling an operation mode of the memory chip according to the input address signal and the at least one command signal, and generating a first control signal according to the determination result;
 a wait controller, coupled to a wait pad, for receiving the first control signal and changing a state of a wait signal at the wait pad according to the first control signal; and
 a wait receiver, coupled to the wait pad, for receiving the wait signal and detecting the state of the wait signal to generate a second control signal;
 wherein when the control unit determines that the memory chip, operating in an active mode, will be changed to operate in an inactive mode according to the input address signal and the at least one command signal, the wait controller changes the state of the wait signal from a de-asserted state to an asserted state according to the first control signal; and
 wherein when the wait receiver detects that the state of the wait signal has been changed from the de-asserted state to the asserted state, the control unit determines whether the memory chip, operating in the inactive mode, will be changed to operate in the active mode according to the input address signal and the second control signal.

2. The memory chip as claimed in claim 1, wherein the control unit comprises:
 an address controller for receiving the input address signal and generating an internal address signal and a third control signal according to the input address signal;
 a first boundary crossing controller for receiving the internal address signal and the second control signal, determining whether the operation mode of the memory chip will be changed according to the internal address signal and the second control signal, and generating the first control signal and a fourth control signal according to the determination result; and
 an operation controller for receiving the third control signal and the fourth control signal and the at least one command signal and controlling the operation of the memory chip according to the third control signal and the fourth control signal.

3. The memory device as claimed in claim 2, wherein when the operation controller controls the memory chip to operate in the active mode according to the third control signal the at least one command signal, if the first boundary crossing controller determines that the memory chip will be changed to operate in the inactive mode according to the internal address signal, the wait controller changes the state of the wait signal from the de-asserted state to the asserted state according to the first control signal, and the first boundary crossing controller updates the address controller to change the internal address signal.

4. The memory device as claimed in claim 3, wherein after the wait controller changes the state of the wait signal from the de-asserted state to the asserted state according to the first control signal, the operation controller controls the memory chip to operate in the inactive mode according to the fourth control signal.

5. The memory device as claimed in claim 2,
 wherein when the operation controller controls the memory chip to operate in the inactive mode according to the third control signal and the at least one command signal, if the wait receiver detects that the state of the wait signal has been changed from the de-asserted state to the asserted state, the first boundary crossing controller determines whether the memory chip will be changed to operate in the active mode according to the internal address signal and the second control signal; and
 wherein if the first boundary crossing controller determines that the memory chip will be changed to operate in the active mode, the first boundary crossing controller updates the address controller according to the second control signal to change the internal address signal.

6. The memory device as claimed in claim 5, wherein after the first boundary crossing controller determines that the memory chip will be changed to operate in the active mode, the operation controller controls the memory chip to operate in the active mode according to the fourth control signal.

7. The memory device as claimed in claim 2, wherein the control unit further comprises:
 a second boundary crossing controller for receiving the internal address signal, determining whether a word-line boundary crossing operation is performed to the memory chip according to the internal address signal when the operation controller controls the memory chip to operate in the active mode according to the third control signal and the at least one command signal, and generating a fifth control signal according to the determination result for the wait controller.

8. The memory device as claimed in claim 7, wherein when the operation controller controls the memory chip to operate in the active mode according to the third control signal and the at least one command signal, if the second boundary crossing controller determines that the word-line boundary crossing operation will be performed, the wait controller changes the state of the wait signal from the de-asserted state to the asserted state according to the fifth control signal, and the second boundary crossing controller updates the address controller to change the internal address signal.

9. The memory device as claimed in claim 7,
wherein the second boundary crossing controller further determines whether the word-line boundary crossing operation is performed to another memory chip according to the internal address signal and the second control signal; and
wherein if the second boundary crossing controller determines that the word-line boundary crossing operation will be performed to another memory chip, the second boundary crossing controller updates the address controller to change the internal address signal.

10. A memory device comprising:
a first memory chip for receiving an input address signal and coupled to a wait pad; and
a second memory chip for receiving the input address signal and coupled to the wait pad, wherein the first memory chip and the second memory chip alternately operate in an active mode, and each of the first memory chip and the second memory chip comprises:
a control unit for receiving the input address signal and at least one command signal, determining and controlling an operation mode of the corresponding memory chip according to the input address signal and at least one command signal, and generating a first control signal according to the determination result;
a wait controller, coupled to the wait pad, for receiving the first control signal and changing a state of a wait signal at the wait pad according to the first control signal; and
a wait receiver, coupled to the wait pad, for receiving the wait signal and detecting the state of the wait signal to generate a second control signal,
wherein when the first memory chip operates in an active mode and the second memory chip operates in an inactive mode, if the control unit of the first memory determines that the first memory chip will be changed to operate in the inactive mode according to the input address signal, the wait controller of the first memory changes the state of the wait signal from a de-asserted state to an asserted state according to the corresponding first control signal; and
wherein when the wait receiver of the second memory chip detects that the state of the wait signal has been changed from the de-asserted state to the asserted state, the control unit of the second memory chip determines whether the second memory chip will be changed to operate in the active mode according to the input address signal and the corresponding second control signal.

11. The memory chip as claimed in claim 10, wherein for each of the first memory chip and the second memory chip, the control unit comprises:
an address controller for receiving the input address signal and the second control signal and generating an internal address signal and a third control signal according to the input address signal;
a first boundary crossing controller for receiving the internal address signal, determining whether the operation mode of the corresponding memory chip will be changed according to the internal address signal and the second control signal, and generating the first control signal and a fourth control signal according to the determination result; and
an operation controller for receiving the third control signal and the fourth control signal and the at least one command signal and controlling the operation of the corresponding memory chip according to the third control signal and the fourth control signal.

12. The memory device as claimed in claim 11, wherein when the operation controller of the first memory chip controls the first memory chip to operate in the active mode according to the corresponding third control signal and the at least one command signal and the operation controller of the second memory chip controls the second memory chip to operate in the inactive mode according to the corresponding third control signal and the at least one command signal, if the first boundary crossing controller of the first memory chip determines that the first memory chip will be changed to operate in the inactive mode according to the corresponding internal address signal, the wait controller of the first memory chip changes the state of the wait signal from the de-asserted state to the asserted state according to the corresponding first control signal, the first boundary crossing controller of the first memory chip updates the address controller of the first memory chip to change the corresponding internal address signal, and the first boundary crossing controller of the second memory chip updates the address controller of the second memory chip according to the corresponding second control signal to change the corresponding internal address signal.

13. The memory device as claimed in claim 12, wherein after the wait controller of the first memory chip changes the state of the wait signal from the de-asserted state to the asserted state according to the corresponding first control signal, the operation controller of the first memory chip controls the first memory chip to operate in the inactive mode according to the corresponding fourth control signal, and the operation controller of the second memory chip controls the second memory chip to operate in the active mode according to the corresponding fourth control signal.

14. The memory device as claimed in claim 12,
wherein when the wait receiver of the second memory chip detects that the state of the wait signal has been changed from the de-asserted state to the asserted state, the first boundary crossing controller of the second memory chip determines whether the second memory chip will be changed to operate in the active mode according to the corresponding internal address signal and the corresponding second control signal; and
wherein if the first boundary crossing controller of the second memory chip determines that the second memory chip will be changed to operate in the active mode, the first boundary crossing controller of the second memory chip updates the address controller of the second memory chip according to the corresponding second controls signal to change the corresponding internal address signal, and the first boundary crossing controller of the first memory chip updates the address controller of the first memory chip to change the corresponding internal address signal.

15. The memory device as claimed in claim 14, wherein after the first boundary crossing controller of the second memory chip determines that the second memory chip will be changed to operate in the active mode, the operation controller of the second memory controls the second memory chip to operate in the active mode according to the corresponding fourth control signal, and the operation controller of the first memory chip controls the first memory chip to operate in the inactive mode according to the corresponding fourth control signal.

16. The memory device as claimed in claim 11, for each of the first memory chip and the second memory chip, wherein the control unit further comprises:
a second boundary crossing controller for receiving the internal address signal, determining whether a word-line boundary crossing operation of the corresponding memory chip will be performed to the corresponding memory chip according to the internal address signal when the operation controller controls the corresponding memory chip to operate in the active mode according to the third control signal and the at least one command signal, and generating a fifth control signal according to the determination result for the wait controller.

17. The memory device as claimed in claim 16, wherein when the operation controller controls the corresponding memory chip to operate in the active mode according to the third control signal and the at least one command signal, if the second boundary crossing controller determines that the boundary crossing operation of the corresponding memory chip will be performed, the wait controller changes the state of the wait signal from the de-asserted state to the asserted state according to the fifth control signal, and the second boundary crossing controller updates the address controller to change the internal address signal.

18. The memory device as claimed in claim 17, wherein after the wait controller changes the state of the wait signal from the de-asserted state to the asserted state, the boundary crossing operation of the corresponding memory chip is performed.

19. The memory device as claimed in claim 16,
wherein for each of the first memory chip and the second memory chip, the second boundary crossing controller further determines whether the word-line boundary crossing operation will be performed to the other memory chip according to the internal address signal and the second control signal; and
if the second boundary crossing controller determines that the word-line boundary crossing operation will be performed to the other memory chip, the second boundary crossing controller updates the address controller to change the internal address signal.

* * * * *